(12) United States Patent
Hsu

(10) Patent No.: US 7,169,624 B2
(45) Date of Patent: Jan. 30, 2007

(54) SHARED BIT LINE CROSS-POINT MEMORY ARRAY MANUFACTURING METHOD

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 144 days.

(21) Appl. No.: 11/130,981

(22) Filed: May 16, 2005

(65) Prior Publication Data

US 2005/0207248 A1    Sep. 22, 2005

Related U.S. Application Data

(60) Division of application No. 10/404,292, filed on Mar. 31, 2003, now Pat. No. 6,927,430, which is a continuation-in-part of application No. 09/965,586, filed on Sep. 26, 2001, now Pat. No. 6,569,745, which is a continuation-in-part of application No. 09/893,830, filed on Jun. 28, 2001, now Pat. No. 6,693,821, and a continuation-in-part of application No. 09/894,922, filed on Jun. 28, 2001, now Pat. No. 6,531,371.

(51) Int. Cl.
*H01L 21/00* (2006.01)
*H01L 29/76* (2006.01)

(52) U.S. Cl. ............... 438/3; 438/253; 438/593; 438/201; 438/393; 257/295; 365/138

(58) Field of Classification Search ............... 438/3, 438/257, 593–595; 257/295; 365/138
See application file for complete search history.

(56) References Cited

U.S. PATENT DOCUMENTS

2002/0000597 A1 *  1/2002  Okazawa ............... 257/298

* cited by examiner

*Primary Examiner*—Dung A. Le
(74) *Attorney, Agent, or Firm*—David C. Ripma

(57) ABSTRACT

A shared bit line cross-point memory array structure is provided, along with methods of manufacture. The memory structure comprises a bottom word line with a top word line overlying the bottom word line. A bit line is interposed between the bottom word line and the top word line such that a first cross-point is formed between the bottom word line and the bit line and a second cross-point is formed between the bit line and the top word line. A resistive memory material is provided at each cross-point above and below the bit line. A diode is formed at each cross-point between the resistive memory material and either the top word line or the bottom word line, respectively.

8 Claims, 4 Drawing Sheets

SHARED BIT LINE CROSS-POINT MEMORY ARRAY MANUFACTURING METHOD

CROSS-REFERENCE TO RELATED APPLICATIONS

This application is a divisional of U.S. patent application Ser. No. 10/404,292, now U.S. Pat. No. 6,927,430, filed Mar. 31, 2003, entitled Shared Bit Line Cross-Point Memory Array Incorporating P/N Junctions, which is a continuation-in-part of U.S. patent application Ser. No. 09/965,586, now U.S. Pat. No. 6,569,745, filed on Sep. 26, 2001, entitled Shared Bit Line Cross-Point Memory Array, which is a continuation-in-part of U.S. patent application Ser. No. 09/893,830, now U.S. Pat. No. 6,693,821, filed Jun. 28, 2001, entitled Low Cross-talk Electrically Programmable Resistance Cross Point Memory, and of U.S. patent application Ser. No. 09/894,922, now U.S. Pat. No. 6,531,371, also filed Jun. 28, 2001, entitled Electrically Programmable Resistance Cross Point Memory. The above-identified applications are incorporated herein by reference.

Application Ser. No. 10/391,292, now U.S. Pat. No. 6,905,937, filed Mar. 17, 2003, entitled Cross-Point Resistor Memory Array and Method of Fabrication; application Ser. No. 10/391,290 now U.S. Pat. No. 6,825,058, filed Mar. 17, 2003, entitled Trench Isolated Cross-Point Memory Array and Method of Fabrication; and application Ser. No. 10/350,643, now U.S. Pat. No. 6,875,651, filed Jan. 23, 2003, entitled Dual-Trench Isolated Cross-point Memory Array and Method for Fabricating Same are also incorporated herein by reference.

BACKGROUND OF THE INVENTION

New materials, referred to herein as resistive memory materials, are now making it possible to produce non-volatile memory cells based on a change in resistance. Materials having a perovskite structure, among them colossal magnetoresistance (CMR) materials, are materials that have electrical resistance characteristics that can be changed by external influences.

For instance, the properties of materials having perovskite structures, especially CMR materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity, or the same polarity but with wider width, from those used to induce the initial change.

SUMMARY OF THE INVENTION

Accordingly, a shared bit line cross-point memory array structure is provided comprising a first cross-point array with a second cross-point array overlying the first cross-point array such that they share the bit line. The first cross-point memory array comprises a plurality of bit lines and a first plurality of word lines arranged so that they cross over each other to form a plurality of cross-points; a first layer of resistive memory material interposed between the bit lines and the first plurality of word lines, and a first array of diodes formed between the resistive memory material and the first plurality of word lines, wherein each diode is located at a cross-point between the plurality of bit lines and the first plurality of word lines. The second cross-point memory array comprises the plurality of bit lines and a second plurality of word lines arranged so that they cross over each other to form a plurality of cross-points; a second layer of resistive memory material interposed between the bit lines and the second plurality of word lines, and a second array of diodes formed between the resistive memory material and the second plurality of word lines, wherein each diode is located at a cross-point between the plurality of bit lines and the second plurality of word lines Methods of forming the shared bit line cross-point array are also provided. An initial cross-point memory array is provided having bit lines exposed. A layer of resistive memory material is deposited over the exposed bit lines, and electrode stacks are formed overlying the bit lines, such that the resistive memory material in interposed between the electrodes stacks and the bit lines. The electrode stacks may be formed by depositing a layer of metal, depositing a layer of polysilicon and patterning the layers forming electrode stacks. The polysilicon may then be doped and counterdoped to produce a diode. Top electrodes may then be formed over the electrode stacks to form a second cross-point array in connection with the shared bit lines.

DETAILED DESCRIPTION OF THE INVENTION

Figure 1:
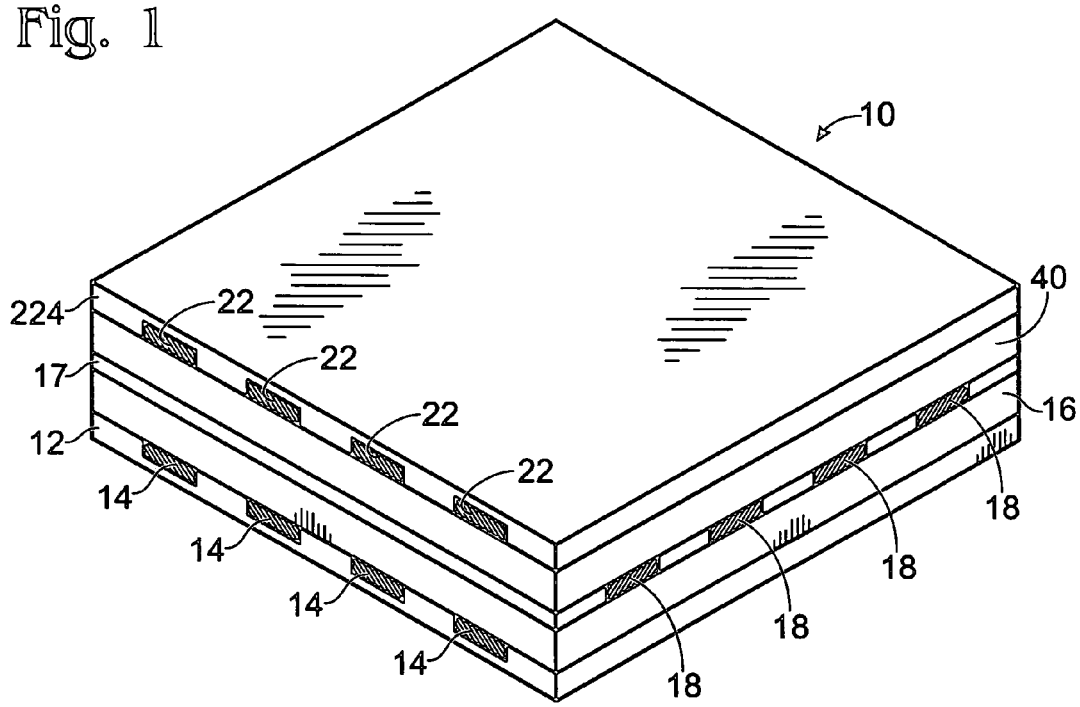
FIG. 1 is an isometric view of a shared bit line cross-point memory array

FIG. 1 illustrates the basic configuration of a shared bit line cross-point array area 10. The shared bit line cross-point array area 10 comprises a bottom set of word lines 14 forming a cross-point with the bit lines 18, with resistive memory material layer 16 interposed between them. In one alternative embodiment, a layer of insulating material 17 isolates the bit lines 18 from each other. A top set of word lines 22 also forms a cross-point with the bit lines 18, with resistive memory material 40 interposed between them. In this manner the bit line is shared. Diodes are located at each cross-point, both above and below the shared bit line, not shown.

Figure 2:
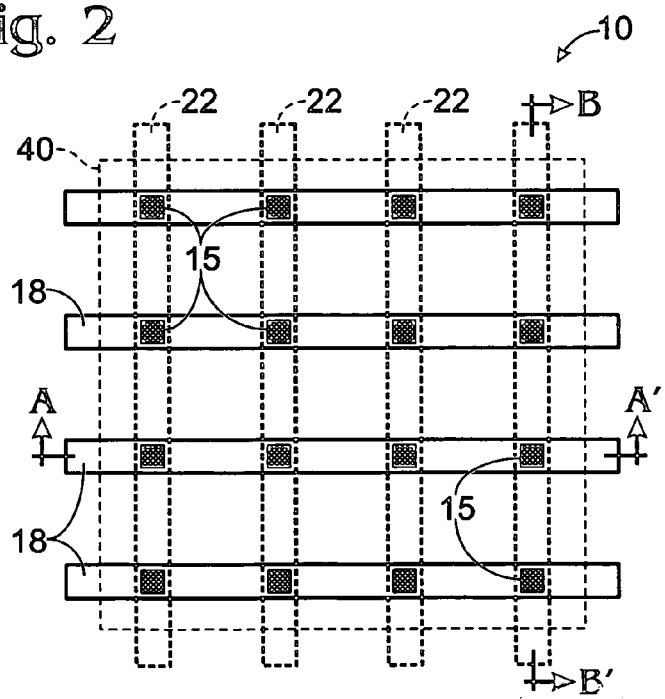
FIG. 2 is a top view of a resistive memory array.

FIG. 2 shows the cross-point memory array area 10. The memory array area 10 comprises a substrate with word lines 14 formed thereon. The lines 14 may be doped lines. Diodes 15 may comprise a doped portion of the lines 14 with the opposite polarity dopants. The resistive memory material layer 16 overlies the plurality of lines 14. A plurality of bit electrodes 18 overlay the resistive memory material layer 16, such that the resistive memory material layer 16 is interposed between the diodes 15 and the bit electrodes 18.

The bit electrodes 18 and the lines 14 are each preferably substantially parallel rows. The bit electrodes 18 and the lines 14 are arranged in a cross-point arrangement such that they cross each other in a regular pattern. A cross-point refers to each position where a bit electrode 18 crosses a line 14. Likewise cross-points are formed where the top electrodes 22 cross over the bit electrodes 18. As shown, the bit electrodes and the lines are arranged at substantially 90 degrees with respect to each other.

FIGS. 1 and 2 show just the memory array area. It should be clear that in an actual device, the substrate, the lines 14, the top electrodes 22 and the bit electrodes 18 may extend well beyond the memory array area, which is defined by the resistive memory material layers 16 and 40. In one embodiment the active layer is substantially continuous, such that the active layer extends across more than one cross-point. The lines 14 and the bit electrodes 18 may connect to other support circuitry, which is not shown, on the same substrate.

FIGS. 3–9 illustrate the process for forming a shared bit line resistive memory array. Those figures denoted with an A correspond to a cross-section taken along A–A' in FIG. 2. Likewise, those figures denoted with a B correspond to a cross-section taken along B–B' in FIG. 2.

Figure 3A:
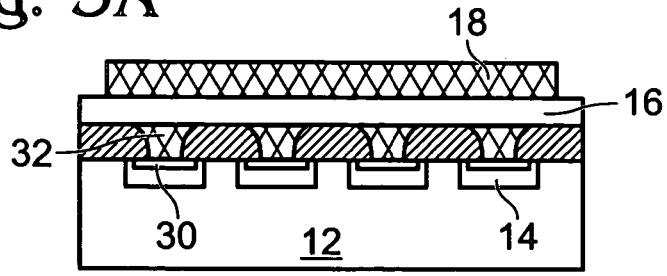
FIGS. 3A and 3B are cross-sections corresponding to A–A' and B–B' respectively in FIG. 2 following initial processing.
Figure 3B:
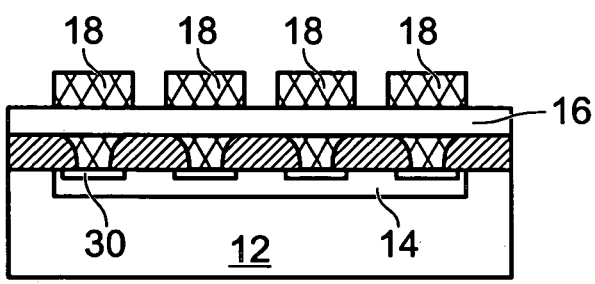

Referring now to FIGS. 3 and 4, which show exemplary structures of a cross-point memory arrays. FIGS. 3A and 3B show the cross-sections of a cross-point memory array comprising a substrate 12 having doped lines 14, which serve as a first set of word lines in the present line memory array. Diodes are formed by counter doping regions 30 of the doped lines 14. For example, if using n-type doped lines 14, the regions 30 will be p-type. Bottom electrodes 32 are formed over the regions 30. The bottom electrodes 32 are preferably platinum, iridium, ruthenium or other suitable material. A first layer of resistive memory material is interposed between the bottom electrodes 32 and the bit lines 18.

Figure 4A:
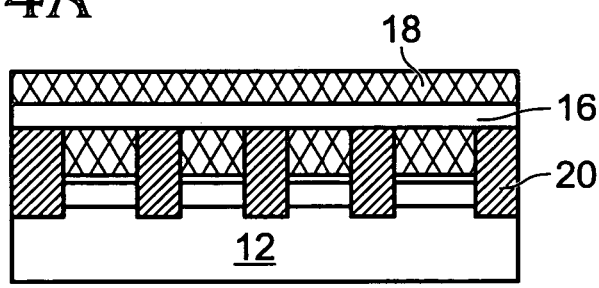
FIGS. 4A and 4B are cross-sections corresponding to A–A' and B–B' respectively in FIG. 2 following initial processing.
Figure 4B:
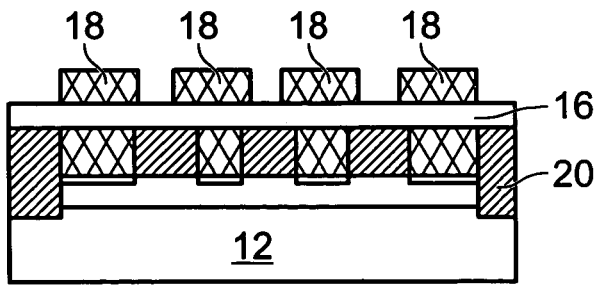

FIGS. 4A and 4B, show an alternative exemplary embodiment that further includes trench isolation 20 between adjacent doped lines 14. The trench isolation reduces cross talk between adjacent doped lines 14. In another embodiment, a dual trench isolation structure could be used. In addition to these examples, additional structures could be formed to act as an initial cross-point memory array structure.

Whichever structure is used, these may be formed in connection with the formation of support electronics. Supporting electronics are defined here as any non-memory devices, which may be connected to the resistive memory array, such as coding, decoding, data processing or computing circuitry. Additional details of these structures are provided in the patent applications referenced and incorporated by reference, as identified above.

Figure 5A:
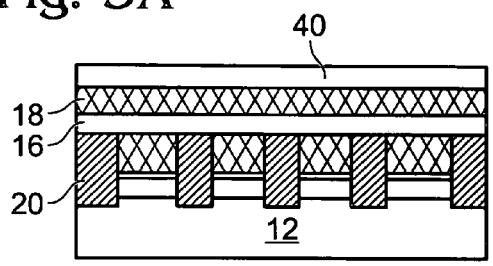
FIGS. 5A and 5B are cross-sections corresponding to A–A' and B–B' respectively in FIG. 2 during processing.
Figure 5B:
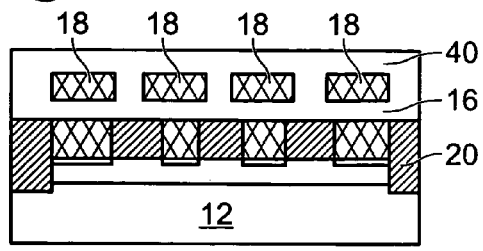

After forming the initial memory structure, a second resistive memory layer 40 is deposited over the bit lines 18, as shown in FIGS. 5A and 5B. For purposes of this illustration, the starting structure of FIGS. 4A and 4B have been used. The second resistive memory layer 40 is preferably formed to have the same thickness as that of the first resistive memory material layer 16. The second resistive memory layer 40 is preferably a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+5}$. The resistive memory material 40 is preferably between about 5 nm and 500 nm thick. The resistive memory material 40 can be deposited using any suitable deposition technique including pulsed laser deposition, rf-sputtering, e-beam evaporation, thermal evaporation, metal organic deposition, sol gel deposition, spin coating, and metal organic chemical vapor deposition. Some of the deposition processes may be self-leveling, others may require planarization, using for example CMP, to both planarize and control the thickness. The second resistive memory layer 40 may be removed from outside the memory array area by ion milling or other suitable process.

As shown in FIG. 5B the second resistive memory layer 40 has also filled the space between adjacent bit lines 18 so that it is in contact with resistive memory layer 16. In another embodiment, a different insulating material, for example oxide, or other insulator, could be used to isolate the bit lines 18 from each other prior to depositing the second resistive memory material layer 40. For example, the insulating material may be deposited and then planarized to expose the bit lines 18.

Figure 6A:
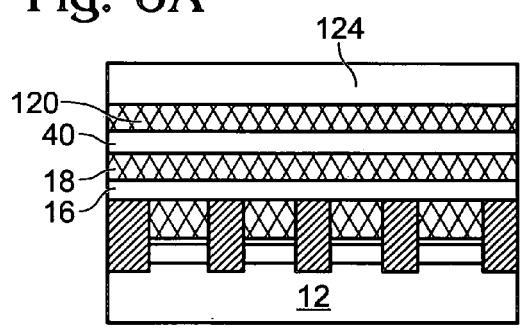
FIGS. 6A and 6B are cross-sections corresponding to A–A' and B–B' respectively in FIG. 2 during processing.
Figure 6B:
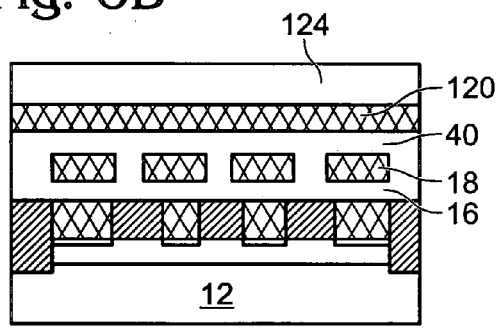
Figure 7A:
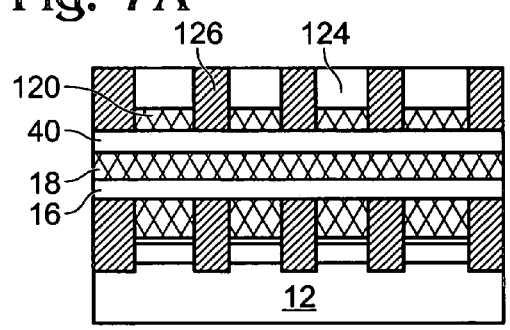
FIGS. 7A and 7B are cross-sections corresponding to A–A' and B–B' respectively in FIG. 2 during processing.
Figure 7B:
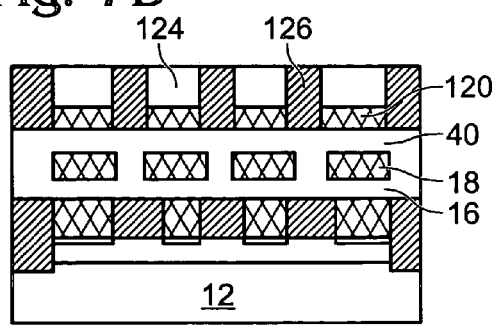

Referring now to FIGS. 6A and 6B, a top electrode material 120 is deposited. The top electrode material 120 may be platinum, iridium, copper, silver, gold, or other suitable material. A layer of polysilicon 124 is deposited overlying the top electrode material. The layer of polysilicon 124 is preferably between approximately 400 nm and 1000 nm thick. Although not shown, a barrier layer may be deposited to a thickness of between approximately 5 nm and 20 nm prior to depositing the layer of polysilicon 124. The barrier material is preferably TiN, TaN, WN, TiTaN or other suitable barrier material.

A layer of photoresist, or a hard mask, is used to protect the memory bit locations overlying regions of the bit lines 18. The layer of polysilicon and the top electrode material 120 are etched, for example using a plasma etch process, leaving polysilicon/electrode stacks which will comprise the upper memory cells. If a barrier layer is present, it will also be etched along with the polysilicon and electrodes. In an alternative embodiment, the etch process will over etch at least partially into the second resistive memory layer 40. The photoresist or hard mask is then removed, and an insulating material 126, for example CVD oxide, is deposited to fill trenches formed by the etching process. In one embodiment the oxide is completely fills the trenches. In an alternative embodiment the insulating material is deposited to a thickness greater than the thickness of the layer of polysilicon 124, for example between approximately 1.3 and 1.5 times thicker. The insulating material 126 is then planarized, for example using CMP, stopping at the layer of polysilicon 124 to produce the structure shown in FIGS. 7A and 7B.

Figure 8A:
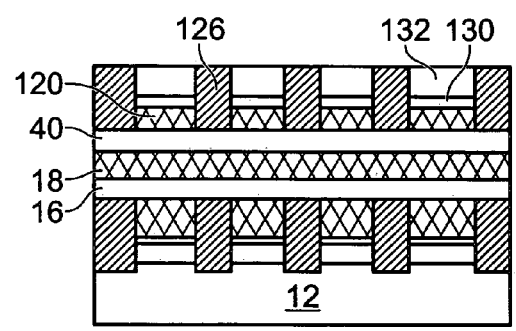
FIGS. 8A and 8B are cross-sections corresponding to A–A' and B–B' respectively in FIG. 2 during processing.
Figure 8B:
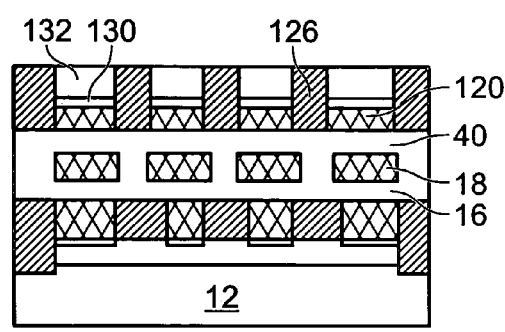

The remaining portions of the layer of polysilicon 124 are then doped. For example, boron may be used to make the polysilicon p-type. In one embodiment, boron is implanted at an energy of between approximately 100 keV and 200 keV, at a dose of between $1\times10^{14}/cm^2$ and $1\times10^{15}/cm^2$. A counter dopant may then be used to convert an upper region of the p-type polysilicon into n-type. For example, phosphorous could be implanted at an energy of between approximately 60 keV and 150 keV at a dose of between $5\times10^{14}/cm^2$ and $5\times10^{15}/cm^2$. Annealing at a temperature of between approximately 400 degrees Celsius and 600 degrees Celsius for between approximately 30 minutes and 2 hours activates the dopants, in this example boron and phosphorous, to form diodes; and recrystallizes the polysilicon. As shown in FIGS. 8A and 8B, p-type regions 130 and n-type regions 132 form diodes overlying the top electrode material 120.

Figure 9A:
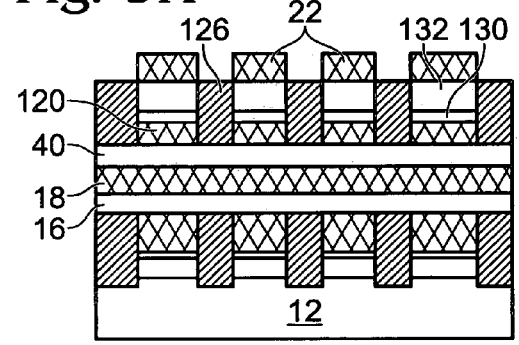
FIGS. 9A and 9B are cross-sections corresponding to A–A' and B–B' respectively in FIG. 2 during processing.
Figure 9B:
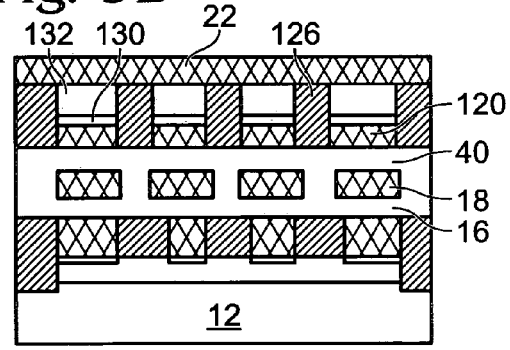

Deposit interconnects metal and pattern to form the top word lines 22, as shown in FIGS. 9A and 9B. The top word lines 22 form cross-points with the bit lines 18. In a preferred embodiment, the top word lines 22 are perpendicular to the bit lines 18, as shown. The combination of above-mentioned structures form an array of diode/metal electrode stacks (132/130/120) overlying the layer of resistive memory material 40, which is positioned above the plurality of bit lines 18. A shared bit line memory structure is produced having an upper memory cell, which in the example provided comprises a metal/n$^+$ polysilicon/p$^+$ polysilicon/metal stacked electrode overlying a resistive memory layer. Each stacked electrode is isolated from adjacent stacked electrodes. Although not shown, a barrier layer may be deposited to a thickness of between approximately 5 nm and 20 nm prior to depositing the layer of polysilicon 124. The barrier material is preferably TiN, TaN, WN, TiTaN or other suitable barrier material.

In one embodiment, the memory array structure is passivated and interconnected to supporting circuitry or other devices formed on the same substrate. It may also be possible to combine some of the steps discussed above, with those used to form the support circuitry, if any.

The examples provided above all utilized n-type doped lines on a p-type substrate or p-well, with P+ dots to form the diodes. However, It is also possible to construct a resistive memory array with the opposite polarity. The doped lines would be p-type lines, formed in an n-type substrate or n-well, with N+ dots to form the diodes. The doping sequence used to form the upper memory cell could be modified to produce a metal/p+ polysilicon/n+ polysilicon/metal stacked electrode.

Although various exemplary embodiments have been described above, it should be understood that additional variations might be made within the scope of the invention, which is defined by the claims and their equivalents.

What is claimed is:

1. A method of manufacturing a memory structure comprising:
    a) providing a resistive cross-point memory array structure having a plurality of bit lines;
    b) depositing a layer of resistive memory material overlying the plurality of bit lines;
    c) forming an array of diode/metal electrode stacks overlying the layer of resistive memory material positioned above the plurality of bit lines, where the diode/metal electrode stacks are n+ polysilicon/p+ polysilicon/metal electrode stacks; and
    d) patterning a plurality of top electrodes overlying the electrode stack to form a plurality of cross-points with the plurality of bit lines.

2. The method of claim 1, further comprising depositing an insulating material overlying the plurality of bit lines and planarizing the insulating material to expose the plurality of bit lines prior to depositing the layer of resistive memory material, whereby bit lines are isolated from each other by the insulating material.

3. The method of claim 1, wherein forming an array of diode/metal electrode stacks further comprises depositing a metal layer overlying the resistive memory material; depositing a polysilicon layer overlying the metal layer; patterning the polysilicon layer and the metal layer to form polysilicon/metal electrode stacks; isolating the polysilicon/metal electrode stacks; doping the polysilicon with a dopant, and doping the polysilicon with a counter dopant, whereby the polysilicon forms a diode.

4. The method of claim 3, further comprising depositing a barrier layer overlying the metal layer prior to depositing the polysilicon layer.

5. The method of claim 3, wherein the dopant is boron, and the counter dopant is phosphorous.

6. The method of claim 5, wherein doping the polysilicon with boron comprises implanting boron ions at an energy of between approximately 100 keV and 200 keV and a dose of between approximately $1 \times 10^{14}/cm^2$ and $1 \times 10^{15}/cm^2$.

7. The method of claim 5, wherein doping the polysilicon with phosphorous comprises implanting phosphorous ions at an energy of between approximately 60 keV and 150 keV and a dose of between approximately $5 \times 10^{14}/cm^2$ and $5 \times 10^{15}/cm^2$.

8. A method of manufacturing a memory structure comprising:
    a) providing a resistive cross-point memory array structure having a plurality of bit lines;
    b) depositing a layer of resistive memory material overlying the plurality of bit lines;
    c) forming an array of diode/metal electrode stacks overlying the layer of resistive memory material positioned above the plurality of bit lines, where the diode/metal electrode stacks are p+ polysilicon/n+ polysilicon/metal electrode stacks; and
    d) patterning a plurality of top electrodes overlying the electrode stack to form a plurality of cross-points with the plurality of bit lines.

* * * * *